(12) United States Patent
Du

(10) Patent No.: US 11,309,374 B2
(45) Date of Patent: Apr. 19, 2022

(54) MASK COMPONENT

(71) Applicant: WUHAN CHINA STAR OPTOELECTRONICS SEMICONDUCTOR DISPLAY TECHNOLOGY CO., LTD., Wuhan (CN)

(72) Inventor: Xiao Du, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 374 days.

(21) Appl. No.: 16/619,993

(22) PCT Filed: Oct. 15, 2019

(86) PCT No.: PCT/CN2019/111202
§ 371 (c)(1),
(2) Date: Dec. 6, 2019

(87) PCT Pub. No.: WO2020/248449
PCT Pub. Date: Dec. 17, 2020

(65) Prior Publication Data
US 2021/0335965 A1    Oct. 28, 2021

(30) Foreign Application Priority Data

Jun. 14, 2019 (CN) .......................... 201910514173.8

(51) Int. Cl.
*H01L 51/00* (2006.01)
*H01L 27/32* (2006.01)
*G03F 1/22* (2012.01)

(52) U.S. Cl.
CPC ............ *H01L 27/3272* (2013.01); *G03F 1/22* (2013.01); *H01L 27/3234* (2013.01); *H01L 2227/323* (2013.01)

(58) Field of Classification Search
CPC ............. H01L 27/3272; H01L 27/3234; H01L 2227/323; H01L 51/0011; H01L 51/56; G03F 1/22; C23C 14/042
See application file for complete search history.

(56) References Cited

U.S. PATENT DOCUMENTS

2021/0135113 A1* 5/2021 Wang .................. H01L 51/5253

FOREIGN PATENT DOCUMENTS

| CN | 104157550 A | 11/2014 |
| CN | 205954096 U | 2/2017 |

(Continued)

*Primary Examiner* — Donald L Raleigh
(74) *Attorney, Agent, or Firm* — Osha Bergman Watanabe & Burton LLP

(57) ABSTRACT

A mask component includes a first mask plate and a second mask plate, and the first mask plate includes a first shield region, a first open region disposed in the first shield region, an electronic component shield region disposed in the first open region, a connecting shield region disposed in the first open region. The electronic component shield region is connected to the first shield region by the connecting shield region. The connecting shield region includes a first connecting shield region disposed on one side of the electronic component shield region and a second connecting shield region disposed on another side of the electronic component shield region, and the first mask plate is configured to evaporate a common electrode to obtain a first region of the common electrode.

20 Claims, 10 Drawing Sheets

(56) References Cited

FOREIGN PATENT DOCUMENTS

| | | | |
|---|---|---|---|
| CN | 107236927 | A | 10/2017 |
| CN | 108559948 | A | 9/2018 |
| CN | 109306450 | A | 2/2019 |
| CN | 110257768 | A | 9/2019 |
| WO | 2016204019 | A1 | 12/2016 |
| WO | 2018024040 | A1 | 2/2018 |

* cited by examiner

MASK COMPONENT

BACKGROUND OF INVENTION

Field of Invention

The present invention relates to a field of display technology, and more particularly to a mask component.

Description of Prior Art

Common electrode of light emitting layer of organic light emitting diode (OLED) display panels causes a decrease in light transmittance and affects quality of camera module disposed under screens, and common electrodes disposed on the entire layer affects light transmittance of electronic component shield region.

Therefore, present OLED display panels have a technical problem where the common electrode of the electronic component region affects the light transmittance, which requires improvement.

SUMMARY OF INVENTION

Currently, the common electrode of the electronic component region in the organic light emitting diode (OLED) display panel affects light transmittance, and embodiments according to the present invention are provided to solve the problem.

A mask component includes a first mask plate and a second mask plate, and the first mask plate includes a first shield region, a first open region disposed in the first shield region, an electronic component shield region disposed in the first open region, a connecting shield region disposed in the first open region, the electronic component shield region is connected to the first shield region by the connecting shield region, the connecting shield region includes a first connecting shield region disposed on one side of the electronic component shield region and a second connecting shield region disposed on another side of the electronic component shield region, and the first mask plate is configured to evaporate a common electrode to obtain a first region of the common electrode. The second mask plate includes a second shield region, a second open region disposed in the second shield region, and the electronic component shield region disposed in the second open region, the second shield region corresponds to the first open region and the first shield region, and the second mask plate is configured to evaporate the common electrode to obtain a second region of the common electrode.

In one embodiment, the first connecting shield region is connected to one side of the first open region.

In one embodiment, the first connecting shield region is a I-shape.

In one embodiment, the first connecting shield region is connected to a long side of the first open region.

In one embodiment, the first connecting shield region is connected to a short side of the first open region.

In one embodiment, the first connecting shield region is connected to two sides of the first open region.

In one embodiment, the first connecting shield region is an L-shape.

In one embodiment, the first connecting shield region is connected to three sides of the first open region.

In one embodiment, the first connecting shield region is a T-shape.

In one embodiment, the first connecting shield region is connected to four sides of the first open region.

In one embodiment, an area of the second open region is greater than an area of the first connecting shield region.

In one embodiment, a border of the first open region of the first mask plate is extended further from a panel display region by 50 to 500 µm.

In one embodiment, a border of the second open region of the second mask plate is extended further from the first shield region by 50 to 500 µm.

In one embodiment, the first connecting shield region surrounds the electronic component shield region.

In one embodiment, the electronic component is a camera, and the electronic component shield region is a circular shape.

In one embodiment, the electronic component is an under-display call module, and the electronic component shield region is a rectangular shape.

In one embodiment, a border of the electronic component shield region is extended further from the electronic component by 50 to 500 µm.

In one embodiment, the first mask plate has a thickness of 0.02 to 0.2 mm.

In one embodiment, the second mask plate has a thickness of 0.02 to 0.2 mm.

In one embodiment, a thickness of the first mask plate is greater than a thickness of the second mask plate.

A mask component is provided. The mask component includes a first mask plate and a second mask plate, and the first mask plate includes a first shield region, a first open region disposed in the first shield region, an electronic component shield region disposed in the first open region, a connecting shield region disposed in the first open region, the electronic component shield region is connected to the first shield region by the connecting shield region, the connecting shield region includes a first connecting shield region disposed on one side of the electronic component shield region and a second connecting shield region disposed on another side of the electronic component shield region, and the first mask plate is configured to evaporate a common electrode to obtain a first region of the common electrode. The second mask plate includes a second shield region, a second open region disposed in the second shield region, and the electronic component shield region disposed in the second open region, the second shield region corresponds to the first open region and the first shield region, and the second mask plate is configured to evaporate the common electrode to obtain a second region of the common electrode. When the common electrode is evaporated, the first region of the common electrode is evaporated by using the first mask plate, and the first region of the common electrode is not provided with a common electrode in the connecting shield region and the electronic component shield region. The second region of the common electrode is evaporated by using the second mask plate. The second region of the common electrode is provided with a common electrode in the connecting shield region, and the first region and the second region of the common electrode are configured to form a common electrode, and the common electrode is not provided in the electronic component shield region.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

DETAILED DESCRIPTION OF PREFERRED EMBODIMENTS

Figure 1:
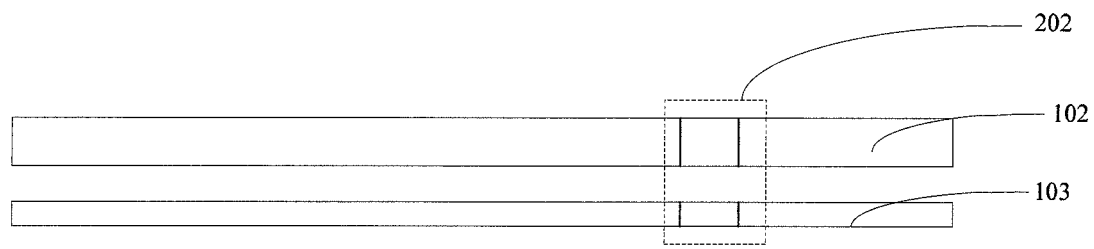
FIG. 1 is a cross-sectional view of a mask component according to one embodiment of the present invention.

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

Currently, the common electrode of the electronic component region in the organic light emitting diode (OLED) display panel affects light transmittance. Embodiments according to the present invention are provided to solve the problem.

Figure 2:
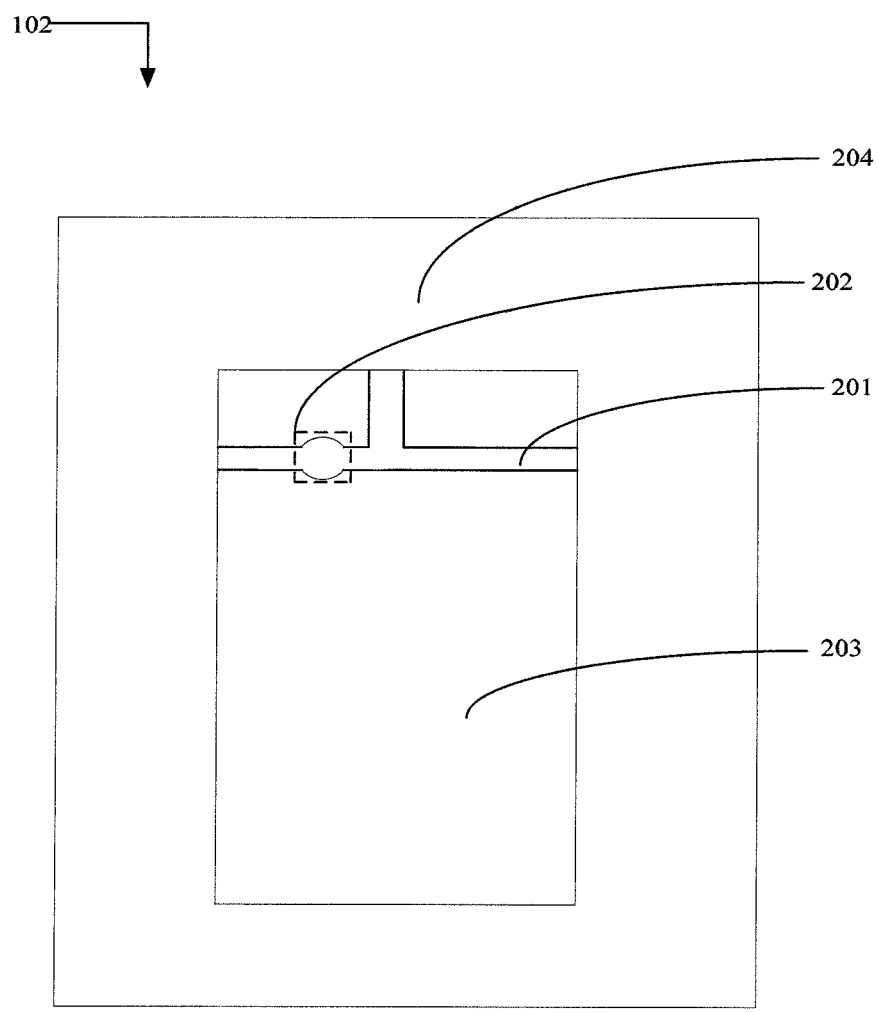
FIG. 2 is a first top plan view of a first mask according to one embodiment of the present invention.
Figure 3:
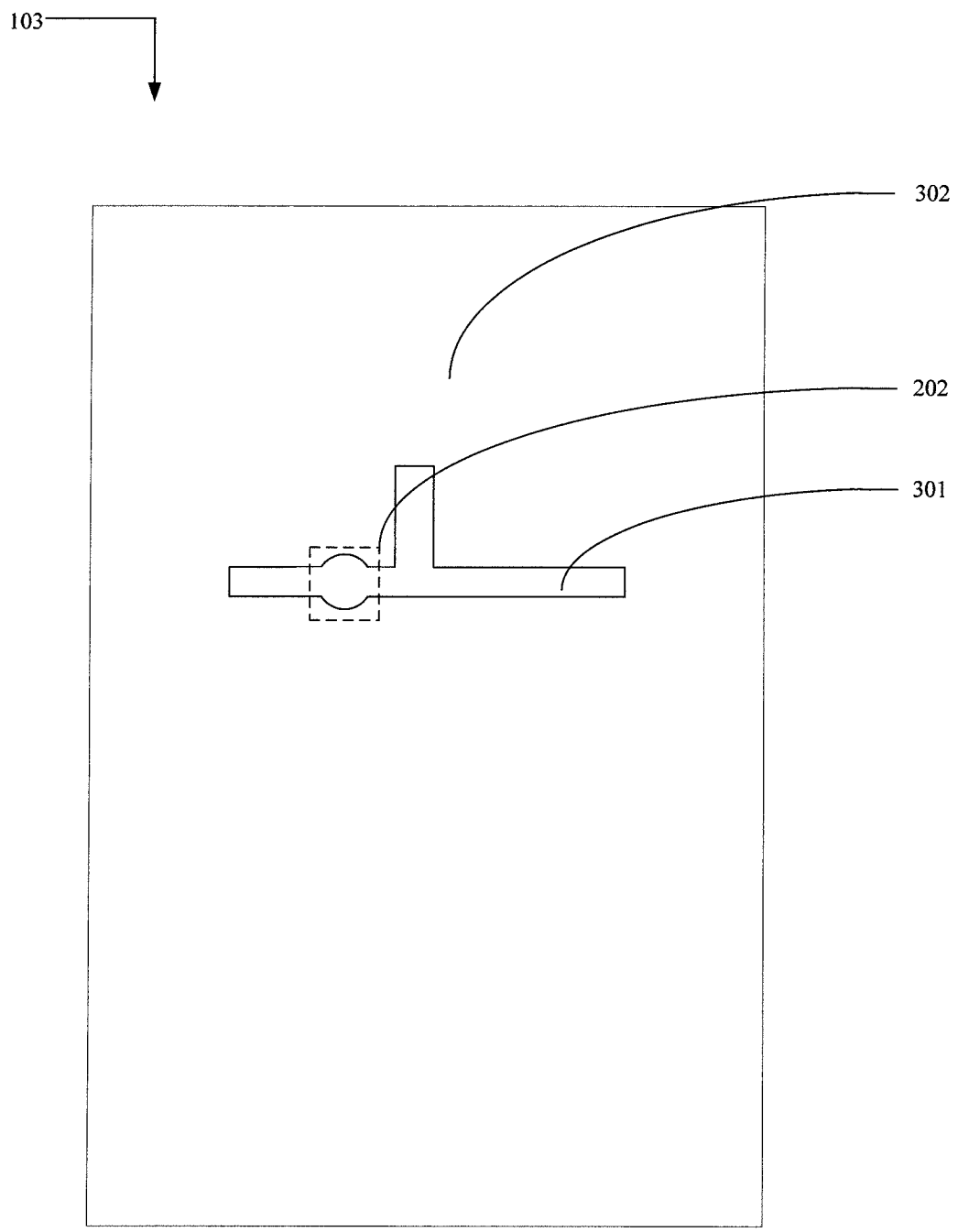
FIG. 3 is a top plan view of a second mask according to one embodiment of the present invention.

Referring to FIG. 1, FIG. 2, and FIG. 3, the dotted line frame is the electronic component shield region. A mask component 10 includes a first mask plate 101 and a second mask plate 102, and the first mask plate 101 includes a first shield region 204, a first open region 203 disposed in the first shield region 204, an electronic component shield region 202 disposed in the first open region 203, a connecting shield region 201 disposed in the first open region 203, the electronic component shield region 202 is connected to the first shield region 204 by the connecting shield region 201, the connecting shield region 201 includes a first connecting shield region 2001 disposed on one side of the electronic component shield region 202 and a second connecting shield region 2002 disposed on another side of the electronic component shield region 202, and the first mask plate 101 is configured to evaporate a common electrode to obtain a first region of the common electrode. The second mask plate 102 includes a second shield region 302, a second open region 301 disposed in the second shield region 302, and the electronic component shield region 202 disposed in the second open region 301, the second shield region 302 corresponds to the first open region 203 and the first shield region 204, and the second mask plate 102 is configured to evaporate the common electrode to obtain a second region of the common electrode.

In the embodiment, the mask component includes a first mask plate and a second mask plate, and the first mask plate includes a first shield region, a first open region disposed in the first shield region, an electronic component shield region disposed in the first open region, a connecting shield region disposed in the first open region, the electronic component shield region is connected to the first shield region by the connecting shield region, the connecting shield region includes a first connecting shield region disposed on one side of the electronic component shield region and a second connecting shield region disposed on another side of the electronic component shield region, and the first mask plate is configured to evaporate a common electrode to obtain a first region of the common electrode. The second mask plate includes a second shield region, a second open region disposed in the second shield region, and the electronic component shield region disposed in the second open region, the second shield region corresponds to the first open region and the first shield region, and the second mask plate is configured to evaporate the common electrode to obtain a second region of the common electrode. When evaporating the common electrode, the first region of the common electrode is evaporated by using the first mask plate, and the first region of the common electrode is not provided with a common electrode in the connecting shield region and the electronic component shield region. The second region of the common electrode is evaporated by using the second mask plate. The second region of the common electrode is provided with a common electrode in the connecting shield region, and the first region and the second region of the common electrode are configured to form a common electrode, and the common electrode is not provided in the electronic component shield region.

Figure 4:
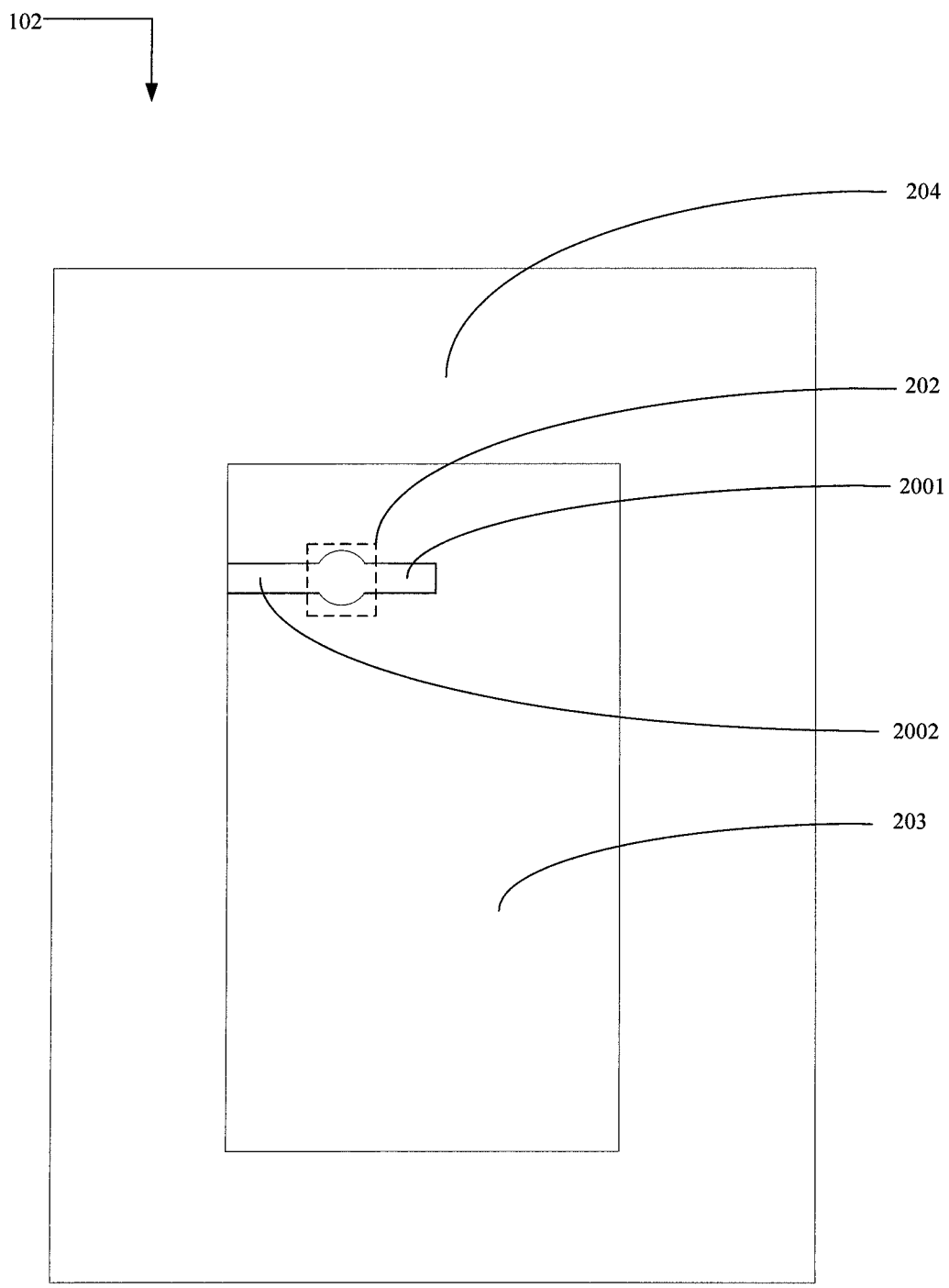
FIG. 4 is a second top plan view of a first mask according to one embodiment of the present invention.

As shown in FIG. 4, in the mask component 10 according to one embodiment, the first connecting shield region 201 is connected to one side of the first open region 203. The electronic component shield region 202 is contacted with the projection of the first connecting shield region 201 on the substrate, and the mask of the electronic component shield region 202 is connected to the first open region 203 through the mask of the first connecting shield region 201, so as to achieve fixed effects.

As shown in FIG. 4, in the mask component 10 according to one embodiment, the first connecting shield region 201 is an I-shape, and the first connecting shield region 201 is connected to one side of the first open region 203.

As shown in FIG. 4, in the mask component 10 according to one embodiment, the first connecting shield region 201 is an I-shape, and the first connecting shield region 201 is connected to a long side of the first open region 203.

In the mask component 10 according to one embodiment, the first connecting shield region 201 is an I-shape, and the first connecting shield region 201 is connected to a short side of the first open region 203.

Figure 5:
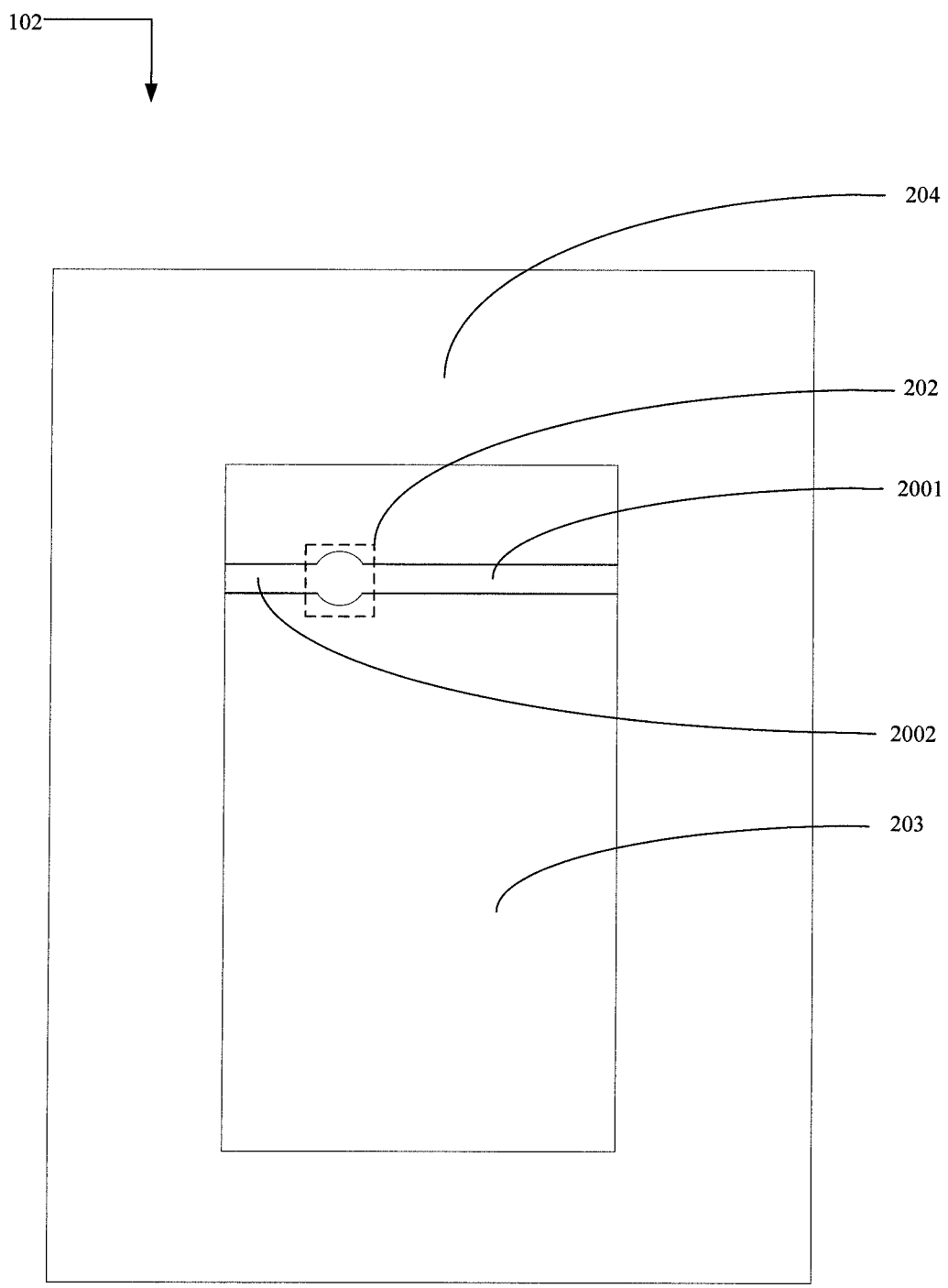
FIG. 5 is a third top plan view of a first mask according to one embodiment of the present invention.

As shown in FIG. 5, in the mask component 10 according to one embodiment, the first connecting shield region 201 is an I-shape, and the first connecting shield region 201 is connected to two sides of the first open region 203.

Figure 6:
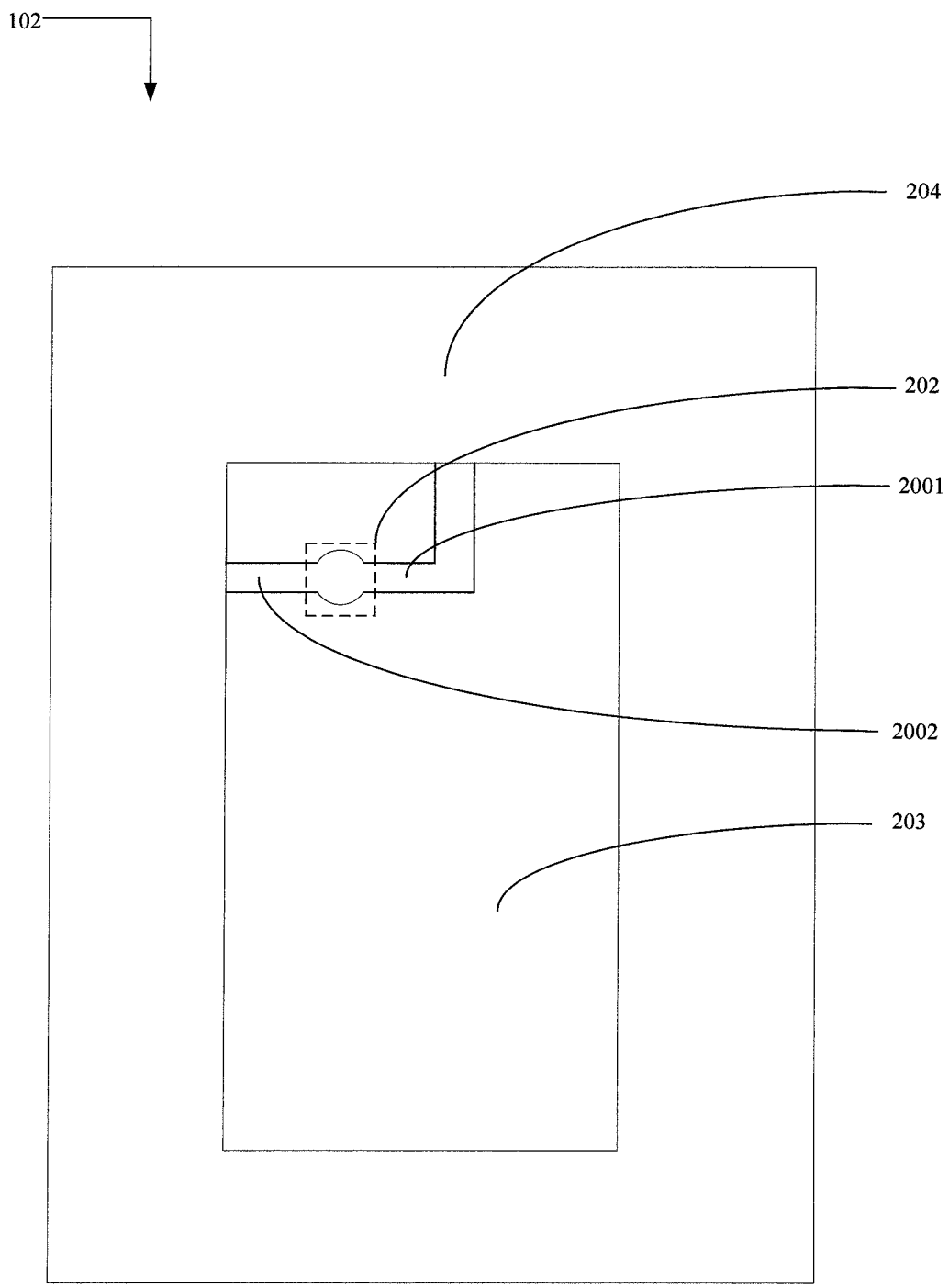
FIG. 6 is a fourth top plan view of a first mask according to one embodiment of the present invention.

As shown in FIG. 6, in the mask component 10 according to one embodiment, the first connecting shield region 201 is an L-shape.

In the mask component 10 according to one embodiment, the first connecting shield region 201 is an L-shape, and the first connecting shield region 201 is connected to a long side of the first open region 203.

In the mask component 10 according to one embodiment, the first connecting shield region 201 is an L-shape, and the first connecting shield region 201 is connected to a short side of the first open region 203.

As shown in FIG. 6, in the mask component 10 according to one embodiment, the first connecting shield region 201 is an L-shape, and the first connecting shield region 201 is connected to two sides of the first open region 203.

Figure 7:
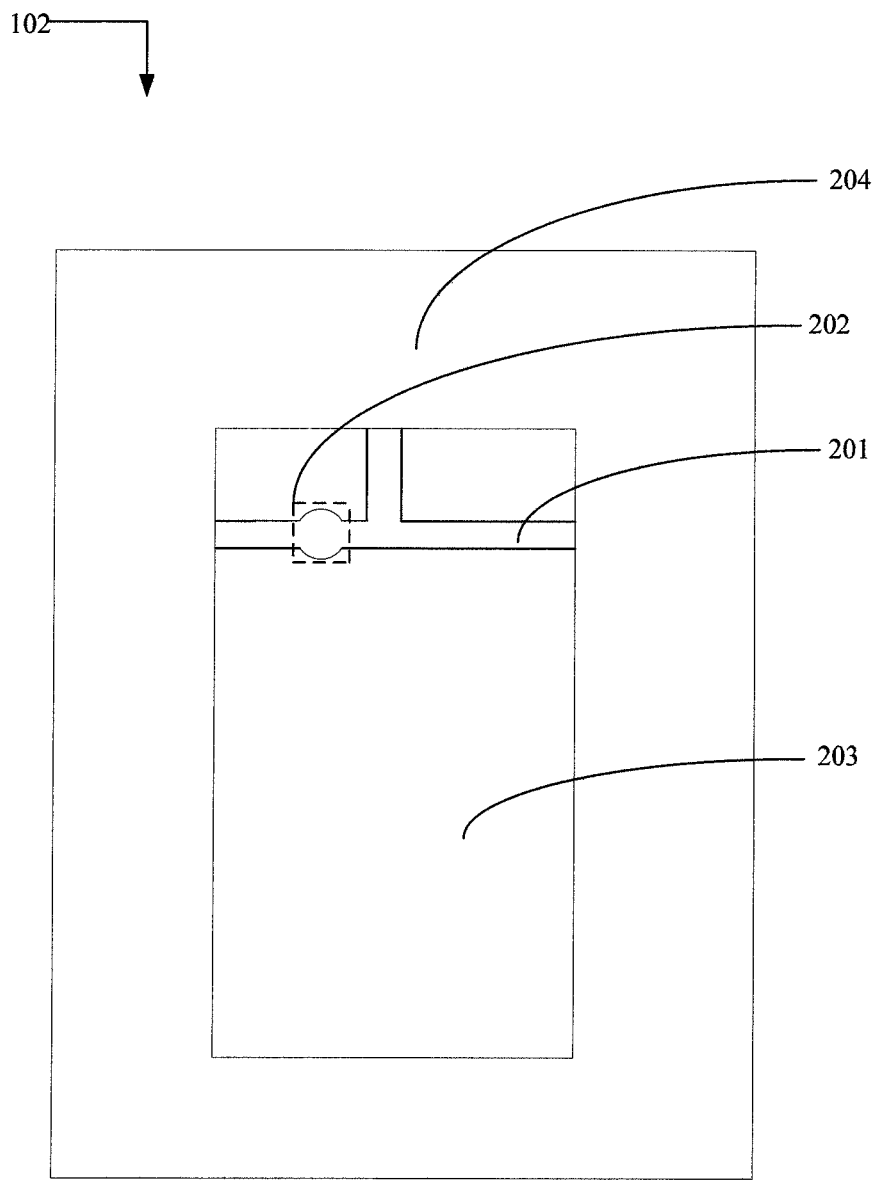
FIG. 7 is a fifth top plan view of a first mask according to one embodiment of the present invention.

As shown in FIG. 7, in the mask component 10 according to one embodiment, the first connecting shield region 201 is connected to three sides of the first open region 203.

As shown in FIG. 7, in the mask component 10 according to one embodiment, the first connecting shield region 201 is a T-shape.

As shown in FIG. 7, in the mask component 10 according to one embodiment, the first connecting shield region 201 is a T-shape, and the first connecting shield region 201 is connected to two long sides and a short side of the first open region 203.

In the mask component 10 according to one embodiment, the first connecting shield region 201 is a T-shape, and the first connecting shield region 201 is connected to two short sides and a long side of the first open region 203.

Figure 8:
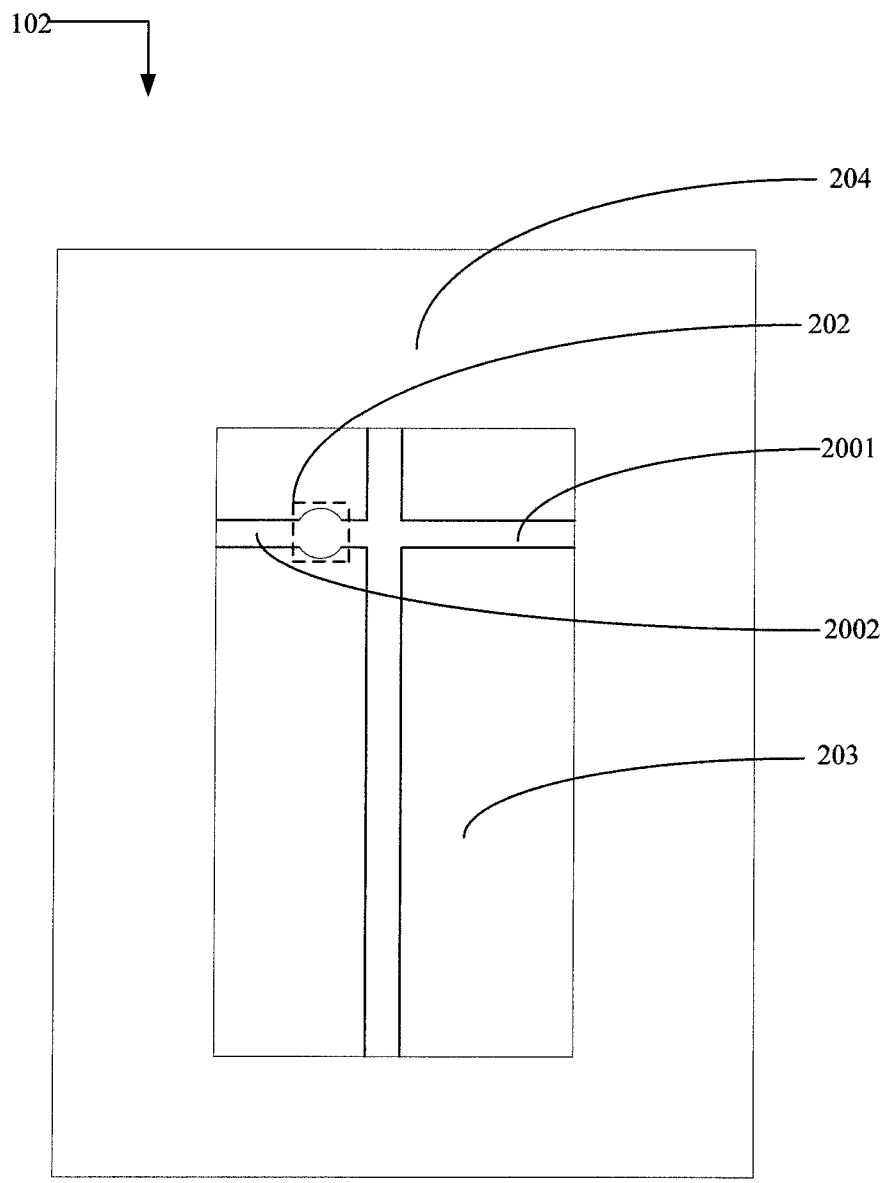
FIG. 8 is a sixth top plan view of a first mask according to one embodiment of the present invention.

As shown in FIG. 8, in the mask component 10 according to one embodiment, the first connecting shield region 201 is connected to four sides of the first open region 203.

In the mask component 10 according to one embodiment, an area of the second open region 301 is bigger than an area of the first connecting shield region 201. When the first connecting shield region 201 is evaporated by using the second mask 102, the area of the second open region 301 is bigger than the area of the first connecting shield region 201, which can ensure the entire common electrode of the first connecting shield region 201 is disposed.

In the mask component 10 according to one embodiment, a border of the first open region 203 of the first mask plate is extended further from a panel display region by 50 to 500 μm, which can ensure the common electrode is evaporated in the entire panel display region.

In the mask component 10 according to one embodiment, a border of the second open region 301 of the second mask plate is extended further from the first shield region 201 by 50 to 500 μm.

In the mask component 10 according to one embodiment, the first connecting shield region 201 surrounds the electronic component shield region 202.

In the mask component 10 according to one embodiment, the electronic component is a camera, and the electronic component shield region 202 is a circular shape.

In the mask component 10 according to one embodiment, the electronic component is an under-display call module, and the electronic component shield region 202 is a rectangular shape.

In the mask component 10 according to one embodiment, a border of the electronic component shield region 202 is extended further from a border of the electronic component by 50 to 500 μm.

In the mask component 10 according to one embodiment, the first mask plate 101 has a thickness of 0.02 to 0.2 mm.

In the mask component 10 according to one embodiment, the first mask plate 101 has a thickness of 0.08 to 0.12 mm.

In the mask component 10 according to one embodiment, the second mask plate 102 has a thickness of 0.02 to 0.2 mm.

In the mask component 10 according to one embodiment, the first mask plate 101 has a thickness of 0.08 to 0.12 mm.

In the mask component 10 according to one embodiment, a thickness of the first mask plate 101 is greater than a thickness of the second mask plate.

In the mask component 10 according to one embodiment, a thickness of the first mask plate 101 is less than a thickness of the second mask plate.

In the mask component 10 according to one embodiment, a thickness of the first mask plate 101 is equal to a thickness of the second mask plate.

Figure 9:
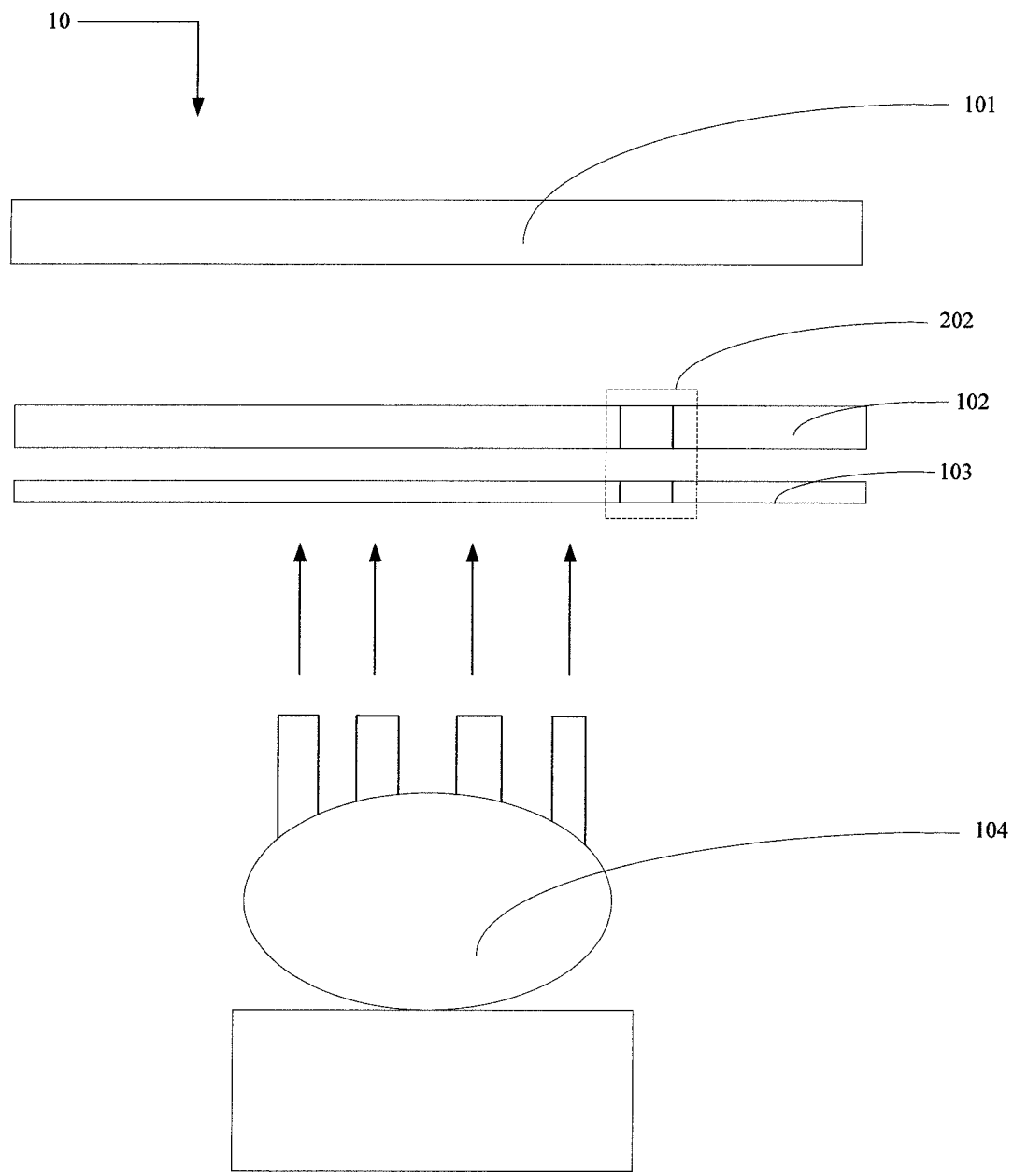
FIG. 9 is a cross-sectional view of an evaporation device according to one embodiment of the present invention.

As shown in FIG. 9, an evaporation device includes a carrier platform, a mask component, and an evaporation unit. The mask component includes a first mask plate and a second mask plate, and the first mask plate includes a first shield region, a first open region disposed in the first shield region, an electronic component shield region disposed in the first open region, a connecting shield region disposed in the first open region, the electronic component shield region is connected to the first shield region by the connecting shield region, the connecting shield region includes a first connecting shield region disposed on one side of the electronic component shield region and a second connecting shield region disposed on another side of the electronic component shield region. The second mask plate includes a second shield region, a second open region disposed in the second shield region, and the electronic component shield region disposed in the second open region, the second shield region corresponds to the first open region and the first shield region.

In the embodiment, the evaporation device includes a first mask plate and a second mask plate, and the first mask plate includes a first shield region, a first open region disposed in the first shield region, an electronic component shield region disposed in the first open region, a connecting shield region disposed in the first open region, the electronic component shield region is connected to the first shield region by the connecting shield region, the connecting shield region includes a first connecting shield region disposed on one side of the electronic component shield region and a second connecting shield region disposed on another side of the electronic component shield region. The second mask plate includes a second shield region, a second open region disposed in the second shield region, and the electronic component shield region disposed in the second open region, the second shield region corresponds to the first open region and the first shield region.

As shown in FIG. 4, in the evaporation device according to one embodiment, the first connecting shield region 201 is connected to one side of the first open region 203. The electronic component shield region 202 is contacted with the projection of the first connecting shield region 201 on the substrate, and the mask of the electronic component shield region 202 is connected to the first open region 203 through the mask of the first connecting shield region 201, so as to achieve fixed effects.

As shown in FIG. 4, in the evaporation device according to one embodiment, the first connecting shield region 201 is an I-shape, and the first connecting shield region 201 is connected to one side of the first open region 203.

As shown in FIG. 4, in the evaporation device according to one embodiment, the first connecting shield region 201 is an I-shape, and the first connecting shield region 201 is connected to a long side of the first open region 203.

In the evaporation device according to one embodiment, the first connecting shield region 201 is an I-shape, and the first connecting shield region 201 is connected to a short side of the first open region 203.

As shown in FIG. 5, in the evaporation device according to one embodiment, the first connecting shield region 201 is an I-shape, and the first connecting shield region 201 is connected to two sides of the first open region 203.

As shown in FIG. 6, in the evaporation device according to one embodiment, the first connecting shield region 201 is an L-shape.

In the evaporation device according to one embodiment, the first connecting shield region 201 is an L-shape, and the first connecting shield region 201 is connected to a long side of the first open region 203.

In the evaporation device according to one embodiment, the first connecting shield region 201 is an L-shape, and the first connecting shield region 201 is connected to a short side of the first open region 203.

As shown in FIG. 6, in the evaporation device according to one embodiment, the first connecting shield region 201 is an L-shape, and the first connecting shield region 201 is connected to two sides of the first open region 203.

As shown in FIG. 7, in the evaporation device according to one embodiment, the first connecting shield region 201 is connected to three sides of the first open region 203.

As shown in FIG. 7, in the evaporation device according to one embodiment, the first connecting shield region 201 is a T-shape.

As shown in FIG. 7, in the evaporation device according to one embodiment, the first connecting shield region 201 is a T-shape, and the first connecting shield region 201 is connected to two long sides and a short side of the first open region 203.

In the evaporation device according to one embodiment, the first connecting shield region 201 is a T-shape, and the first connecting shield region 201 is connected to two short sides and a long side of the first open region 203.

As shown in FIG. 8, in the evaporation device according to one embodiment, the first connecting shield region 201 is connected to four sides of the first open region 203.

In the evaporation device according to one embodiment, an area of the second open region 301 is bigger than an area of the first connecting shield region 201. When the first connecting shield region 201 is evaporated by using the second mask 102, the area of the second open region 301 is bigger than the area of the first connecting shield region 201, which can ensure the entire common electrode of the first connecting shield region 201 is disposed.

In the evaporation device according to one embodiment, a border of the first open region 203 of the first mask plate is extended further from a panel display region by 50 to 500 μm, which can ensure the common electrode is evaporated in the entire panel display region.

In the evaporation device according to one embodiment, a border of the second open region 301 of the second mask plate is extended further from the first shield region 201 by 50 to 500 μm.

In the evaporation device according to one embodiment, the first connecting shield region 201 surrounds the electronic component shield region 202.

In the evaporation device according to one embodiment, the electronic component is a camera, and the electronic component shield region 202 is a circular shape.

In the evaporation device according to one embodiment, the electronic component is an under-display call module, and the electronic component shield region 202 is a rectangular shape.

In the evaporation device according to one embodiment, a border of the electronic component shield region 202 is extended further from a border of the electronic component by 50 to 500 μm.

In the evaporation device according to one embodiment, the first mask plate 101 has a thickness of 0.02 to 0.2 mm.

In the evaporation device according to one embodiment, the first mask plate 101 has a thickness of 0.08 to 0.12 mm.

In the evaporation device according to one embodiment, the second mask plate 102 has a thickness of 0.02 to 0.2 mm.

In the evaporation device according to one embodiment, the first mask plate 101 has a thickness of 0.08 to 0.12 mm.

In the evaporation device according to one embodiment, a thickness of the first mask plate 101 is greater than a thickness of the second mask plate.

In the evaporation device according to one embodiment, a thickness of the first mask plate 101 is less than a thickness of the second mask plate.

In the evaporation device according to one embodiment, a thickness of the first mask plate 101 is equal to a thickness of the second mask plate.

Figure 10:
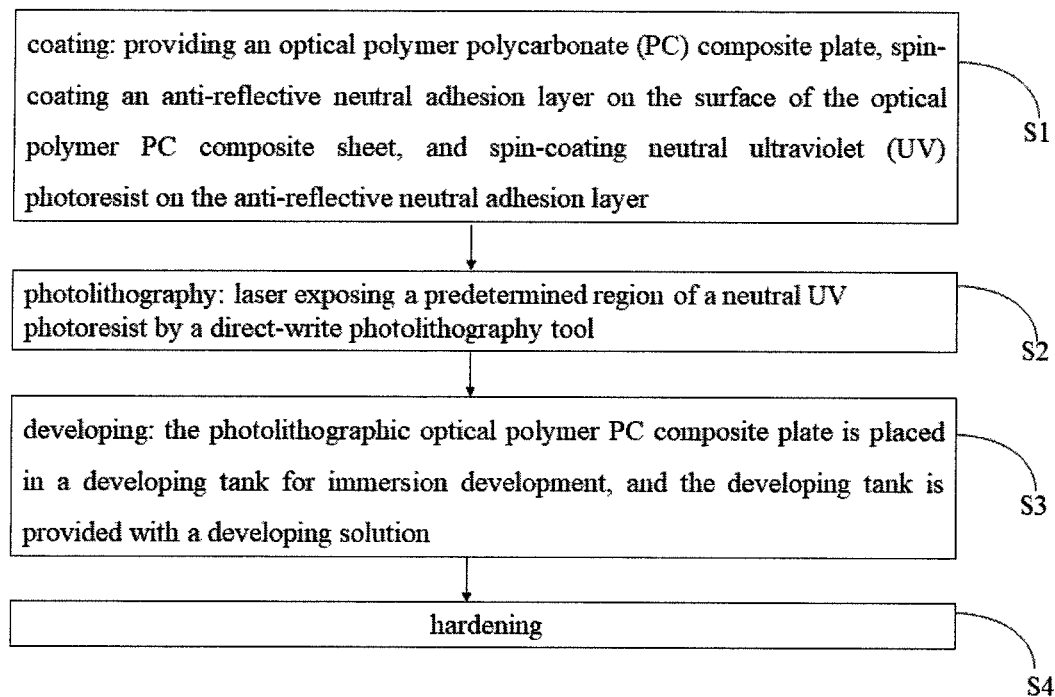
FIG. 10 is a flowchart of a process for fabricating a mask according to one embodiment of the present invention.

As shown in FIG. 10, a method of manufacturing a mask plate includes the following steps:

S1, coating: providing an optical polymer polycarbonate (PC) composite plate, spin-coating an anti-reflective neutral adhesion layer on the surface of the optical polymer PC composite plate and spin-coating neutral ultraviolet (UV) photoresist on the anti-reflective neutral adhesion layer;

S2, photolithography: laser exposing a predetermined region of a neutral UV photoresist by a direct-write photolithography tool;

S3, developing: placing the photolithographic optical polymer PC composite plate in a developing tank for immersion development, and the developing tank is provided with a developing solution; and S4, hardening.

In one embodiment, the UV photoresist is a mixture of neutral UV oil, photoresist, and adjuvant in a ratio of 4:5:1.

In an embodiment, in the step S1, it further includes the following steps:

S11, providing an optical polymer PC composite plate;

S12, coating an anti-reflective neutral adhesion layer on the optical polymer PC composite plate, and the anti-reflective neutral adhesion layer is evenly coated on the entire optical polymer PC composite plate by natural leveling;

S13, After the anti-reflective neutral adhesion layer is dried, a neutral UV photoresist is coated on the anti-reflective neutral adhesion layer, and the neutral UV photoresist is coated on the anti-reflective neutral adhesion layer by a spin-coating method; and S14, baking and curing.

In one embodiment, in the coating process, it is ensured that each layer can be uniformly covered, and then each layer is tightly connected by baking.

Figure 11:
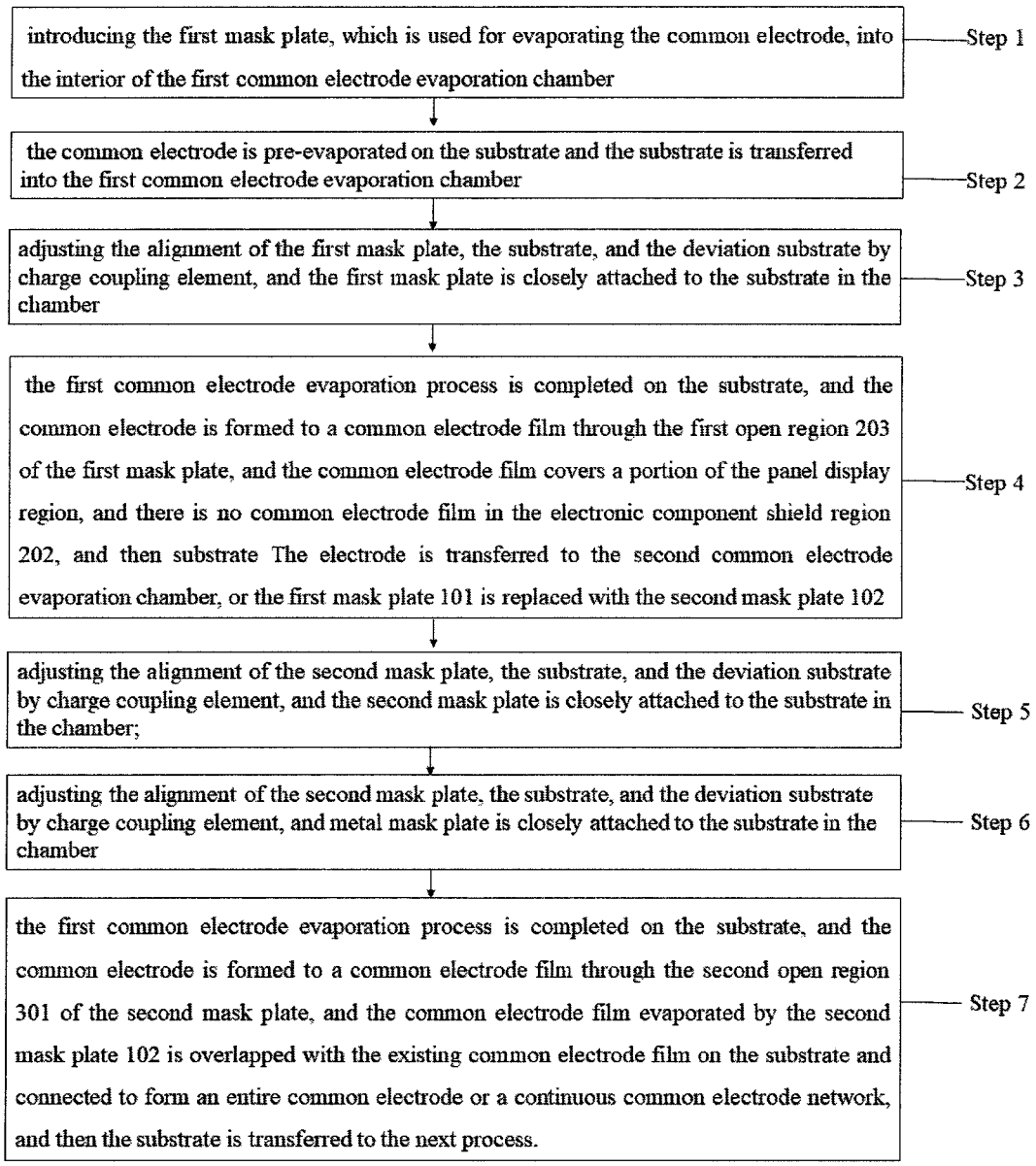
FIG. 11 is a flowchart of a method of evaporating a common electrode of a full screen display panel according to one embodiment of the present invention.

As shown in FIG. 11, a method of evaporating a common electrode of a full screen display panel is described. The method is used for manufacturing a common electrode of full screen light emitting component, and the specific operation and equipment are described as follows:

Step 1, introducing the first mask plate, which is used for evaporating the common electrode, into the interior of the first common electrode evaporation chamber;

Step 2, the common electrode is pre-evaporated on the substrate and transferred into the first common electrode evaporation chamber;

Step 3, adjusting the alignment of the first mask plate 101, the substrate, and the deviation substrate by charge coupling element, and the first mask plate is closely attached to the substrate in the chamber;

Step 4, the first common electrode evaporation process is completed on the substrate, and the common electrode is formed to a common electrode film through the first open region 203 of the first mask plate 101. At this time, the common electrode film covers a portion of the panel display region, and there is no common electrode film in the electronic component shield region 202, and then substrate The electrode is transferred to the second common electrode evaporation chamber, or the first mask plate 101 is replaced with the second mask plate 102;

Step 5, adjusting the alignment of the second mask plate 102, the substrate, and the deviation substrate by charge coupling element, and the second mask plate is closely attached to the substrate in the chamber;

Step 6, adjusting the alignment of the second mask plate 102, the substrate, and the deviation substrate by charge coupling element, and the metal mask plate is closely attached to the substrate in the chamber; and Step 7, the first common electrode evaporation process is completed on the substrate, and the common electrode is formed to a common electrode film through the second mask plate 102 and the second open region 301. At this time, the common electrode film evaporated by the second mask plate 102 is overlapped with the existing common electrode film on the substrate and connected to form an entire common electrode or a continuous common electrode network, and then the substrate is transferred to the next process.

Accordingly, it can be known from the abovementioned embodiments that a mask component is provided. The mask component includes a first mask plate and a second mask plate, and the first mask plate includes a first shield region, a first open region disposed in the first shield region, an electronic component shield region disposed in the first open region, a connecting shield region disposed in the first open region, the electronic component shield region is connected to the first shield region by the connecting shield region, the connecting shield region includes a first connecting shield region disposed on one side of the electronic component shield region and a second connecting shield region disposed on another side of the electronic component shield region, and the first mask plate is configured to evaporate a common electrode to obtain a first region of the common electrode. The second mask plate includes a second shield region, a second open region disposed in the second shield region, and the electronic component shield region disposed in the second open region, the second shield region corresponds to the first open region and the first shield region, and the second mask plate is configured to evaporate the common electrode to obtain a second region of the common electrode. When evaporating the common electrode, the first region of the common electrode is evaporated by using the first mask plate, and the first region of the common electrode is not provided with a common electrode in the connecting shield region and the electronic component shield region. The second region of the common electrode is evaporated by using the second mask plate. The second region of the common electrode is provided with a common electrode in the connecting shield region, and the first region and the second region of the common electrode are configured to form a common electrode, and the common electrode is not provided in the electronic component shield region.

In the above, the present application has been described in, the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A mask component, comprising:
    a first mask plate, wherein the first mask plate comprises a first shield region, a first open region disposed in the first shield region, an electronic component shield region disposed in the first open region, a connecting shield region disposed in the first open region, the electronic component shield region is connected to the first shield region by the connecting shield region, the connecting shield region comprises a first connecting shield region disposed on one side of the electronic component shield region and a second connecting shield region disposed on another side of the electronic component shield region, and the first mask plate is configured to evaporate a common electrode to obtain a first region of the common electrode; and
    a second mask plate, wherein the second mask plate comprises a second shield region, a second open region disposed in the second shield region, and the electronic component shield region disposed in the second open region, the second shield region corresponds to the first open region and the first shield region, and the second mask plate is configured to evaporate the common electrode to obtain a second region of the common electrode.

2. The mask component according to claim 1, wherein the first connecting shield region is connected to one side of the first open region.

3. The mask component according to claim 2, wherein the first connecting shield region is an I-shape.

4. The mask component according to claim 2, wherein the first connecting shield region is connected to a long side of the first open region.

5. The mask component according to claim 2, wherein the first connecting shield region is connected to a short side of the first open region.

6. The mask component according to claim 1, wherein the first connecting shield region is connected to two sides of the first open region.

7. The mask component according to claim 6, wherein the first connecting shield region is an L-shape.

8. The mask component according to claim 1, wherein the first connecting shield region is connected to three sides of the first open region.

9. The mask component according to claim 8, wherein the first connecting shield region is a T-shape.

10. The mask component according to claim 1, wherein the first connecting shield region is connected to four sides of the first open region.

11. The mask component according to claim 1, wherein an area of the second open region is bigger than an area of the first connecting shield region.

12. The mask component according to claim 1, wherein a border of the first open region of the first mask plate is extended further from a panel display region by 50 to 500 μm.

13. The mask component according to claim 1, wherein a border of the second open region of the second mask plate is extended further from the first shield region by 50 to 500 µm.

14. The mask component according to claim 1, wherein the first connecting shield region surrounds the electronic component shield region.

15. The mask component according to claim 1, wherein the electronic component is a camera, and the electronic component shield region is a circular shape.

16. The mask component according to claim 1, wherein the electronic component is an under-display call module, and the electronic component shield region is a rectangular shape.

17. The mask component according to claim 1, wherein a border of the electronic component shield region is extended further from the electronic component by 50 to 500 µm.

18. The mask component according to claim 1, wherein the first mask plate has a thickness of 0.02 to 0.2 mm.

19. The mask component according to claim 1, wherein the second mask plate has a thickness of 0.02 to 0.2 mm.

20. The mask component according to claim 1, wherein a thickness of the first mask plate is greater than a thickness of the second mask plate.

* * * * *